United States Patent
Lung

(10) Patent No.: US 8,981,330 B2
(45) Date of Patent: Mar. 17, 2015

(54) THERMALLY-CONFINED SPACER PCM CELLS

(75) Inventor: Hsiang-Lan Lung, Ardsley, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/550,218

(22) Filed: Jul. 16, 2012

(65) Prior Publication Data

US 2014/0014888 A1    Jan. 16, 2014

(51) Int. Cl.
*H01L 47/00* (2006.01)
*H01L 27/24* (2006.01)
*H01L 45/00* (2006.01)
*G11C 13/00* (2006.01)

(52) U.S. Cl.
CPC ............ *H01L 45/06* (2013.01); *G11C 13/0004* (2013.01); *H01L 27/24* (2013.01); *H01L 45/124* (2013.01); *H01L 45/1253* (2013.01); *H01L 45/1608* (2013.01); *H01L 45/1675* (2013.01)
USPC ...................................... 257/4; 257/E45.002

(58) Field of Classification Search
USPC ........... 257/2–5, E21.004, E45.002, E45.003, 257/E47; 438/382, 468, 510
See application file for complete search history.

(56) References Cited

U.S. PATENT DOCUMENTS

| | | |
|---|---|---|
| 5,389,566 A | 2/1995 | Lage |
| 5,751,012 A | 5/1998 | Wolstenholme et al. |
| 6,507,061 B1 | 1/2003 | Hudgens et al. |
| 6,555,858 B1 | 4/2003 | Jones et al. |
| 6,579,760 B1 | 6/2003 | Lung |
| 6,815,704 B1 | 11/2004 | Chen |
| 6,897,467 B2 | 5/2005 | Doan et al. |
| 7,018,911 B2 | 3/2006 | Lee et al. |
| 7,161,167 B2 | 1/2007 | Johnson |
| 7,394,089 B2 | 7/2008 | Doyle et al. |
| 7,485,891 B2 | 2/2009 | Hamann et al. |
| 7,504,653 B2 | 3/2009 | Lung |
| 7,560,337 B2 | 7/2009 | Ho et al. |
| 7,579,613 B2 | 8/2009 | Lung et al. |
| 7,606,059 B2 | 10/2009 | Toda |
| 7,623,370 B2 | 11/2009 | Toda et al. |
| 7,718,989 B2 | 5/2010 | Lai et al. |
| 7,763,878 B2 | 7/2010 | Horii et al. |
| 7,778,063 B2 | 8/2010 | Brubaker et al. |
| 7,855,378 B2 | 12/2010 | Lin et al. |
| 7,868,313 B2 | 1/2011 | Breitwisch et al. |
| 7,872,908 B2 | 1/2011 | Suh et al. |

(Continued)

OTHER PUBLICATIONS

Kim I.S. et al., "High Performance PRAM Cell Scalable to sub-20nm technology with below 4F 2 Cell Size, Extandable to DRAM Applications," 2010 Symp. on VLSI, Tech. Digest of Papers, Jun. 2010, pp. 203-204.

*Primary Examiner* — William F Kraig
*Assistant Examiner* — Khaja Ahmad
(74) *Attorney, Agent, or Firm* — James F. Hann; Haynes Beffel & Wolfeld LLP

(57) ABSTRACT

A memory device includes an array of contacts and a patterned insulating layer over the array of contacts. The patterned insulating layer includes a trench. The trench includes a sidewall aligned over a plurality of contacts in the array. A plurality of bottom electrodes on a lower portion of the sidewall contacts respective top surfaces of the contacts in the plurality of contacts. A thermally confined spacer of memory material between the patterned insulating layer and an insulating fill material is formed on an upper portion of the sidewall in contact with the plurality of bottom electrodes.

10 Claims, 17 Drawing Sheets

(56) References Cited

U.S. PATENT DOCUMENTS

| | | |
|---|---|---|
| 7,884,343 B2 | 2/2011 | Lung et al. |
| 7,923,286 B2 | 4/2011 | Chen et al. |
| 2002/0042158 A1 | 4/2002 | Kersch et al. |
| 2003/0003647 A1 | 1/2003 | Dennison et al. |
| 2003/0215978 A1 | 11/2003 | Maimon et al. |
| 2004/0026686 A1 | 2/2004 | Lung |
| 2004/0114317 A1 | 6/2004 | Chiang et al. |
| 2005/0019975 A1 | 1/2005 | Lee et al. |
| 2005/0127347 A1 | 6/2005 | Choi et al. |
| 2006/0001174 A1 | 1/2006 | Matsui |
| 2006/0003263 A1 | 1/2006 | Chang |
| 2006/0077741 A1 | 4/2006 | Wang et al. |
| 2006/0110878 A1 | 5/2006 | Lung et al. |
| 2006/0175596 A1 | 8/2006 | Happ et al. |
| 2007/0045605 A1 | 3/2007 | Hsueh |
| 2007/0045606 A1 | 3/2007 | Magistretti et al. |
| 2007/0235710 A1 | 10/2007 | Matsuzaki et al. |
| 2007/0246782 A1 | 10/2007 | Philipp et al. |
| 2008/0006813 A1* | 1/2008 | Hayakawa ............ 257/4 |
| 2008/0116441 A1 | 5/2008 | Raghuram et al. |
| 2008/0157053 A1 | 7/2008 | Lai et al. |
| 2008/0237566 A1* | 10/2008 | An et al. ............ 257/4 |
| 2009/0148980 A1 | 6/2009 | Yu |
| 2009/0184304 A1* | 7/2009 | Chang et al. ............ 257/2 |
| 2009/0225588 A1 | 9/2009 | Czubatyj et al. |
| 2009/0298223 A1 | 12/2009 | Cheek et al. |
| 2010/0054029 A1 | 3/2010 | Happ et al. |
| 2010/0072450 A1* | 3/2010 | Son ............ 257/4 |
| 2010/0193763 A1 | 8/2010 | Chen et al. |
| 2010/0291747 A1 | 11/2010 | Lung et al. |
| 2011/0034003 A1 | 2/2011 | Lung |
| 2011/0180774 A1* | 7/2011 | Park et al. ............ 257/2 |
| 2012/0009731 A1* | 1/2012 | Lee et al. ............ 438/102 |
| 2012/0068136 A1* | 3/2012 | Park et al. ............ 257/1 |

* cited by examiner

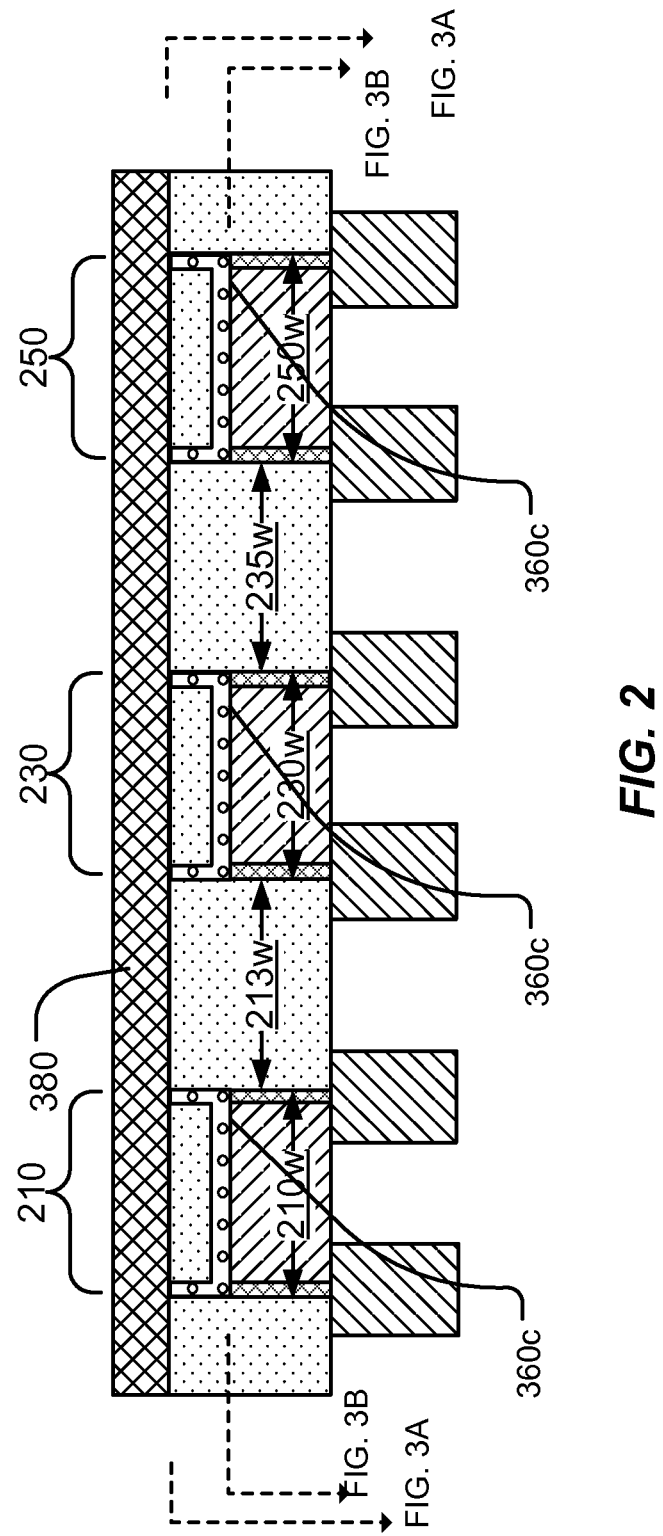

THERMALLY-CONFINED SPACER PCM CELLS

BACKGROUND

1. Field of the Invention

The technology disclosed relates to high density memory devices based on phase change memory materials, and on other programmable resistance materials, and methods for manufacturing such devices.

2. Description of Related Art

In a phase change memory, each memory cell includes a phase change memory element. The phase change memory element is made of phase change materials that exhibit a large resistivity contrast between crystalline (low resistivity) and amorphous (high resistivity) phases.

In operation of a phase change memory element, an electrical current pulse passed through the phase change memory cell can set or reset the resistivity phase of the phase change memory element. To reset the memory element into the amorphous phase, an electrical current pulse with a large magnitude for a short time period can be used to heat up an active region of the memory element to a melting temperature, and then cool quickly causing it to solidify in the amorphous phase. To set the memory element into the crystalline phase, an electrical current pulse with a medium magnitude, which causes it to heat up to a crystallization transition temperature, and a longer cooling time period can be used allowing the active region to solidify in a crystalline phase. To read the state of the memory element, a small voltage is applied to the selected cell and the resulting electrical current is sensed.

As the set and reset operations depend on the temperature of the phase change material, the current or power in operations of phase change memory cells can be reduced by improving the thermal isolation of the memory cells. With improved thermal isolation, more of the power delivered to the memory element can be used to change the temperature of the active region, as opposed to the surrounding structure. Another benefit of thermally confined cells is better cycling endurance due to smaller volume of phase change memory materials. Thus, some design activity has focused on the thermal design of the memory cell. For example, one prior art reference proposes to form a small trench, and use atomic layer deposition (ALD) to fill in the small trench, resulting in a fill-in type memory cell that confines the phase change material, See Kim et al. "High Performance PRAM Cell Scalable to sub-20 nm technology with below $4F^2$ Cell Size, Extendable to DRAM Application," 2010 Symp. on VLSI Tech. Digest of Papers, June 2010, pages 203-204. The fill-in process for this type of memory cell presents a manufacturing issue because of the narrow width within which the material must be deposited. Furthermore, with advances in semiconductor fabrication, device feature size decreases every year. When the feature size decreases, becomes difficult to fill phase change memory materials into the type of small trenches with narrow widths. As a result of this limitation, the process proposed by Kim will not scale well with shrinking process nodes.

It is desirable to provide a scalable memory cell structure with thermal isolation benefits.

SUMMARY OF THE INVENTION

A memory device includes an array of contacts and a patterned insulating layer over the array of contacts. The patterned insulating layer includes a sidewall feature, such as the sidewall of a trench, aligned over a contact in the array of contacts. A bottom electrode is formed on a lower portion of the sidewall feature in contact with a top surface of the contact. A confined layer of memory material deposited using a thin film deposition on the sidewall feature, followed by deposition of an insulating fill material, provides a memory element disposed between, and thermally confined by, the sidewall feature of the patterned insulating layer and the insulating fill material on an upper portion of the sidewall feature and in contact with the bottom electrode. A top electrode is formed over and in contact with the confined layer of memory material.

A trench providing the sidewall feature can extend along a plurality of the contacts in the array of contacts, where additional cells can be formed. Also, the trench may include a second sidewall aligned over a second plurality of contacts in the array, where additional cells can be formed. This can result in a dense array of memory cells having thermally confined sidewall memory elements.

A method for constructing the memory device is also provided.

Other aspects and advantages of the present technology can be seen on review of the drawings, the detailed description and the claims, which follow.

BRIEF DESCRIPTION OF THE DRAWINGS

FIG. 2 is a bit-line cross-section of a portion of an array of thermally-confined spacer PCM cells.

DETAILED DESCRIPTION

A detailed description of implementations of the present technology is provided with reference to the FIGS. 1-17. Preferred implementations are described to illustrate the present technology, not to limit its scope, which is defined by the claims. Those of ordinary skill in the art will recognize a variety of equivalent variations on the description that follows.

Figure 1A:
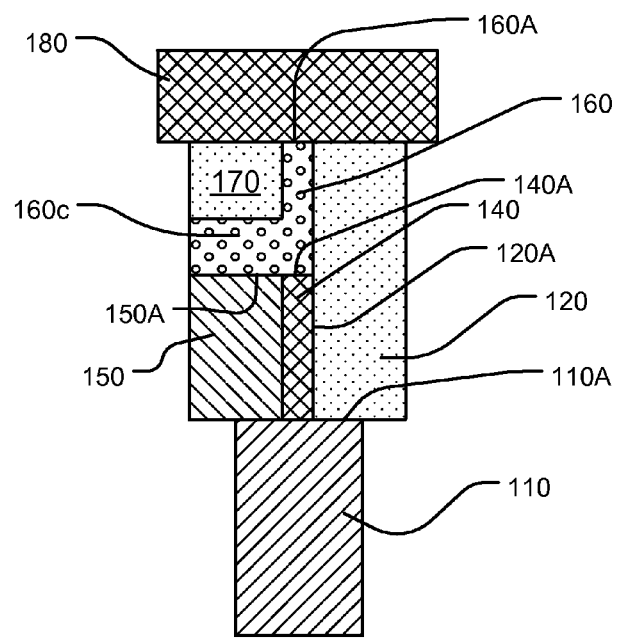
FIG. 1A illustrates an example unit cell in an array of thermally-confined spacer PCM cells.

FIG. 1A illustrates a cross-section of an example thermally-confined memory cell in a memory device, which can include an array of such cells. The memory device can include an array of contacts of which inter-layer contact 110 extending through a via is a member. An array of access devices, such as diodes or transistors, may be coupled to the array of thermally-confined memory cells via the array of contacts.

Alternatively, the array of access devices, such as diodes or transistors, may have contacts on their terminals formed using doped semiconductors, silicide layers or the like, and thereby be coupled directly to the array of thermally-confined memory cells, without using inter-layer contacts like contact 110. Thus a contact can comprise a conductive element, like a conductive plug as illustrated, a doped semiconductor body, a layer of silicide on a transistor element or the like. The contact is in contact with access circuitry, such as transistors or diodes, and bit lines or word lines used to access the cell during operation. The contact 110 has a top surface 110A. In this implementation a patterned insulating layer 120 has a sidewall feature 120A that is aligned (extending into and out of the page in this example) over the top surface 110A of the contact 110.

The memory cell includes a bottom electrode 140 disposed on a lower portion of the sidewall feature 120A in the patterned insulating layer 120, between the sidewall feature 120A and a first insulating fill 150. An "electrode" as used herein is an element that is in electrical contact with, and by which an operating bias is applied to, the memory material. The contact 110 is not an electrode in this sense.

The bottom electrode 140 contacts the top surface 110A of the contact 110. The bottom electrode 140 has an electrode top surface 140A. The electrode top surface 140A of the bottom electrode 140 and a top surface 150A of the first insulating fill 150 are co-planar with each other in this example. The first insulating fill 150 may include a material different from that of the patterned insulating layer 120. One may be a silicon oxide, while the other may be a silicon nitride for example, to facilitate selective etching of the materials.

A confined layer of memory material 160 is disposed between the sidewall feature 120A of the patterned insulating layer 120 and a second insulating fill 170 on an upper portion of the sidewall feature 120A. The second insulating fill 170 may be the same material as is used for the patterned insulating layer, or a different material, as suits a particular design. The confined layer of memory material 160 is in contact with the electrode top surface 140A of the bottom electrode 140. The confined layer of memory material can be "L-shaped" as shown, and include an extension 160c of memory material along and over the top surface 150A of the first insulating fill 150 in some implementations. This confined layer of memory material 160 can be characterized as a "spacer" (1) because it can be manufactured by a spacer process that includes, before forming the second insulating fill, depositing a conformal thin film of the memory material over the sidewall, then anisotropically etching the thin film to remove it from horizontal and sloped surfaces, leaving the confined layer of memory material 160 on the relatively vertical sidewall feature, and (2) because it has a thickness that is not dependent on the lithographic processes used to form the sidewall feature 120A on the patterned insulating layer 120. The extension 160c can be formed using a spacer process by forming a mask over the extension before anisotropic etching.

The confined layer 160 of memory material can be very thin, including thicknesses less than 7.5 nanometers, as determined by the thin film deposition technology used to form the confined layer of memory material 160 on the sidewall feature before the formation of the second insulating fill, and by the minimum thicknesses at which the material can perform its intended memory function. Of course this thickness will vary from material to material.

The confined layer of memory material 160 includes a phase change material in this example. Other programmable resistance materials could be used as well, including for example metal oxide memory materials.

An electrode 180 is formed over and in contact with the top surface 160A of the confined layer of memory material 160, the second insulating fill 170 and the patterned insulating layer 120. The electrode 180 is in contact with a top surface of the confined layer of memory material 160.

Figure 1B:
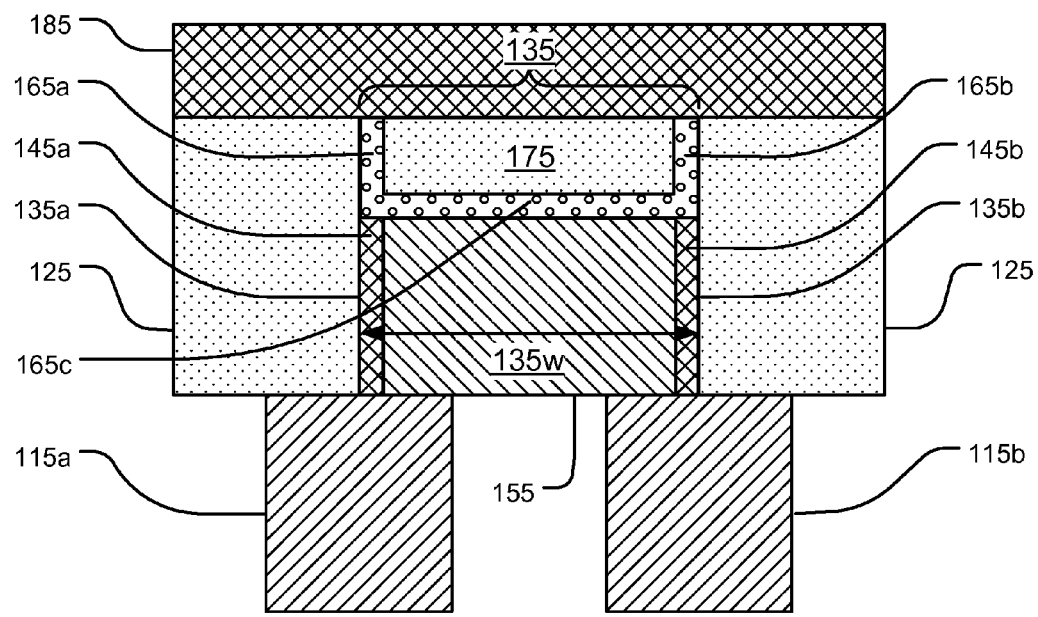
FIG. 1B illustrates an example twin cell in an array of thermally-confined spacer PCM cells.

FIG. 1B illustrates a cross-section of two cells in an example configuration for a memory device including an array of thermally-confined spacer PCM cells. The memory device includes an array of contacts, including contacts 115a and 115b. The memory device includes a patterned insulating layer 125 over contacts 115a and 115b. The patterned insulating layer 125 may include one or more dielectric materials used in semiconductor manufacturing. In the illustrated example, the layer can include a single layer of silicon oxide. The patterned insulating layer 125 includes a trench 135, which extends into and out of the page in this drawing. The trench 135 has a first sidewall 135a and a second, opposing sidewall 135b. The first and second opposing sidewalls are aligned over the top surfaces of respective rows of contacts. Contacts 115a and 115b are members of separate rows in this example. The first sidewall 135a and the second sidewall 135b of the trench 135 can be parallel to each other.

The memory device includes bottom electrodes 145a and 145b, which are members respectively of a first plurality of bottom electrodes along one row of contacts and of a second plurality of bottom electrodes along another row of contacts. The bottom electrodes 145a and 145b are formed on a lower portion of the first sidewall 135a and a lower portion of the second sidewall 135b of the trench 135 within the patterned insulating layer 125, respectively. The bottom electrode 145a contacts the top surface of the contact 115a in the first plurality of contacts. The bottom electrode 145b contacts the top surface of the contact 115b in the second plurality of contacts. Bottom electrodes 145a and 145b are separated by a first insulating fill 155. The electrode top surfaces of the bottom electrodes 145a and 145b and a top surface of the first insulating fill 155 are co-planar with each other.

Confined spacers 165a and 165b of memory material are formed between upper portions of the sidewalls 135a and 135b of the patterned insulating layer 125 and a second insulating fill 175. The spacers are in contact with the electrode top surfaces of bottom electrodes 145a and 145b in the plurality of bottom electrodes. The spacers 165a and 165b in this example are portions of a confined layer of memory material that also includes the portion 165c over the first insulating fill 155. The second insulating fill 175 fills a region bounded within the trench 135 by the confined layer of memory material including spacers 165a and 165b, and the portion 165c.

A thickness of the confined spacer 165a of memory material on the first sidewall 135a of the trench 135 and the confined spacer 165b of memory material on the sidewall 135b of the trench 135 can be very thin, including thicknesses less than 7.5 nanometers, as determined by the thin film deposition technology used to form the film on the sidewalls before the formation of the second insulating fill, and by the minimum thicknesses at which the material can perform its intended memory function. Of course this thickness will vary from material to material. The thicknesses of the confined spacers 165a and 165b may be about the same at the thicknesses of the bottom electrodes 145a and 145b. In some implementations, the bottom electrodes may have different thicknesses than the confined spacers.

The trench 135 has a width 135w which can be equal to approximately twice a minimum lithographic resolution (or smaller) for a lithographic process used to pattern the row of contacts 115a, 115b, where the term "approximately" encompasses a range around the intended width that accommodates manufacturing variations and limits of photolithography in forming a trench having the intended width. Photolithography is the process by which patterns on a semiconductor material are defined using light. The minimum lithographic resolution for a lithographic process determines how fine features in integrated circuits can be created. Features may include the width of a trench or the spacing between adjacent semiconductor strips that include transistors. The higher the minimum lithographic resolution, the finer the semiconductor features can be. The minimum lithographic resolution depends on the size of the wavelength of light used by a lithography machine. The minimum lithographic resolution is commonly referred to as "F" in the art, and twice a minimum lithographic resolution is commonly referred to as "2F" in the art. An area equal to "$4F^2$", is often considered a desired design goal for a memory cell to achieve maximum density. With advanced technology, such as double patterning technology (DPT) and quadruple patterning technology (QPT), the feature size may be even smaller than the minimum lithographic resolution. Consequently, the present technology can result in trenches with even narrower widths than "2F" in which to implement thermally-confined spacer PCM cells, and such memory cells may occupy an area smaller than "$4F^2$" per cell.

In one implementation of the present technology, 1F can equal about 17 nanometers, so 2F equals about 34 nanometers. Since the width 135w of the trench 135 can be approximately 2F for a lithographic process used to form the contacts with a pitch of 2F, the width 135w is approximately 34 nanometers. As described above, the thickness of the confined spacer 165a of memory material on the sidewall 135a of the trench 135 and the second confined spacer 165b of memory material on the sidewall 135b of the trench 135 can be much less than 34 nanometers. Consequently, the memory cell structure of the present technology provides a trench 135 with a width 135w much wider than the combined width of both confined spacers 165a and 165b thus improves the scalability of memory cell structures using phase change materials.

Memory material in both confined spacers 165a and 165b, and the portion 165c of memory material includes a phase change material in this example. In other implementations, different programmable resistance memory materials may be used.

An electrode 185 is formed over both confined spacers 165a and 165b, the second insulating fill and the patterned insulating layer 125. The electrode 185 is in contact with top surfaces of the confined spacers 165a and 165b. The electrode 185 may include titanium nitride (TiN), tantalum nitride (TaN), titanium aluminum nitride (TiAlN), tantalum aluminum nitride (TaAlN), other metals, or metal oxides.

FIG. 2 is a cross-section of three twin cells in an array of thermally confined spacer PCM cells. Descriptions about a single twin cell in reference to FIG. 1B are generally applicable to each of the three twin cells 210, 230 and 250 in FIG. 2. Each twin cell is in a trench. The width (210w, 230w and 250w) of the trench can be twice the minimum lithographic resolution or 2F. The width 213w of the separation between two twin cells 210 and 230 can be twice the minimum lithographic resolution or 2F. The width 235w of the separation between two twin cells 230 and 250 can be twice the minimum lithographic resolution or 2F. In general, the width of a twin cell is 2F and the width of the separation between any two twin cells is also 2F, making the pitch per cell of about 2F in the bit line direction. With advanced technology, such as double patterning technology (DPT) and quadruple patterning technology (QPT), the feature size may be even smaller than the minimum lithographic resolution. Consequently, the present technology can result in trenches with even narrower widths than "2F" in which to implement thermally-confined spacer PCM cells, and such memory cells may occupy an area smaller than "$4F^2$" per cell.

Figure 3A:
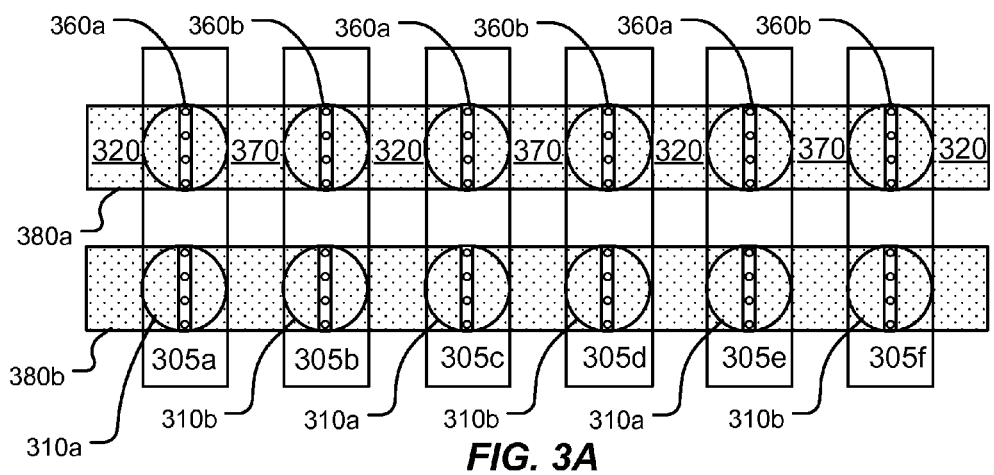
FIGS. 3A-3B illustrate two top views of a portion of an array of thermally-confined spacer PCM cells.
Figure 3B:
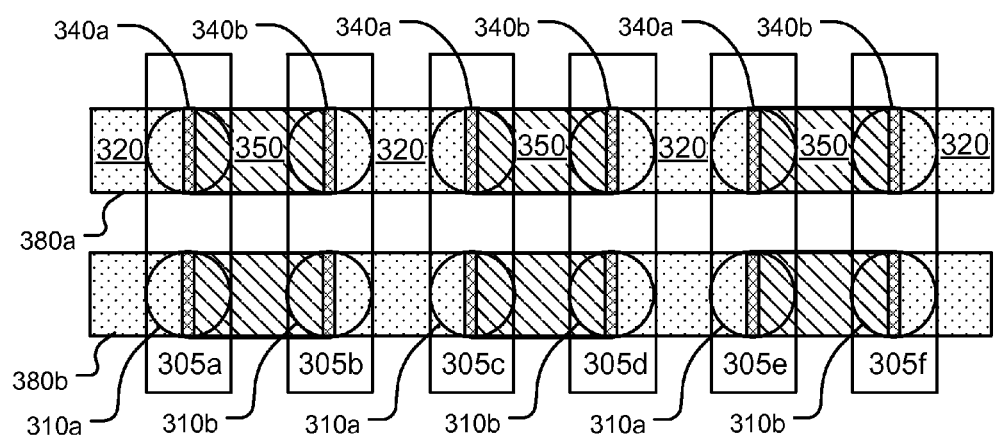

FIGS. 3A-3B illustrate two top views of a portion of an array of thermally-confined spacer PCM cells in the memory device taken along lines shown in FIG. 2. FIG. 2 illustrates that FIG. 3A is taken from below the bottom surface of bit lines 380, and that FIG. 3B is taken from below the bottom surface of a layer of memory material 360c. Descriptions about thermally-confined spacer PCM cells in reference to FIG. 1B and FIG. 2 are generally applicable to FIGS. 3A-3B.

In reference to FIG. 3A and FIG. 3B, a plurality of bit lines extend in parallel in a first direction and a plurality of word lines extend in parallel in a second direction. Thermally-confined spacer PCM cells are formed at intersections of bit lines 380 in the plurality of bit lines, and rows 305a-305f of contacts arranged along the plurality of word lines. Contacts 310a and 310b are aligned with both bit lines 380 and rows 305a-305f of contacts at the intersections. Wordlines (not shown) can be arranged along access devices coupled to the corresponding rows of contacts. Regions 380a and 380b are under two bit lines (e.g. bit line 380 of FIG. 2).

In reference to FIG. 3A, top surfaces of a spacer 360a of memory material and of a second spacer 360b of memory material in multiple memory cells are shown aligned over contacts 310a and 310b for each of the three twin cells 210, 230 and 250. Regions between the two spacers 360a and 360b of memory material in each of the twin cells are filled with an insulating fill material 370. A patterned insulating layer 320 surrounds the twin cells.

In reference to FIG. 3B, top surfaces of bottom electrodes 340a and 340b are shown aligned over contacts 310a and 310b for each of the three twin cells 210, 230 and 250. Regions 350 between two bottom electrodes in each of the twin cells are filled with a dielectric material. A patterned insulating layer 320 surrounds the twin cells.

FIGS. 4-12 are cross-sectional views illustrating sub-assemblies in a fabrication sequence of phase change memory devices having thermally-confined spacer PCM cells. A conventional CVD (chemical vapor deposition), PVD (physical vapor deposition), or ALD (atomic layer deposition) process can be used to fabricate the memory device described herein. To manufacture thermally-confined spacer PCM cells, an array of access devices (not shown) and an array of contacts are first fabricated in a substrate. The array of access devices is coupled to the array of contacts. A memory cell is to be coupled to an access device in the array of access devices via a contact in the array of contacts. An access device may be a diode or a transistor. The access device and the memory cell are typically electrically coupled in series between a bit line and a source line in a memory array.

Figure 4:
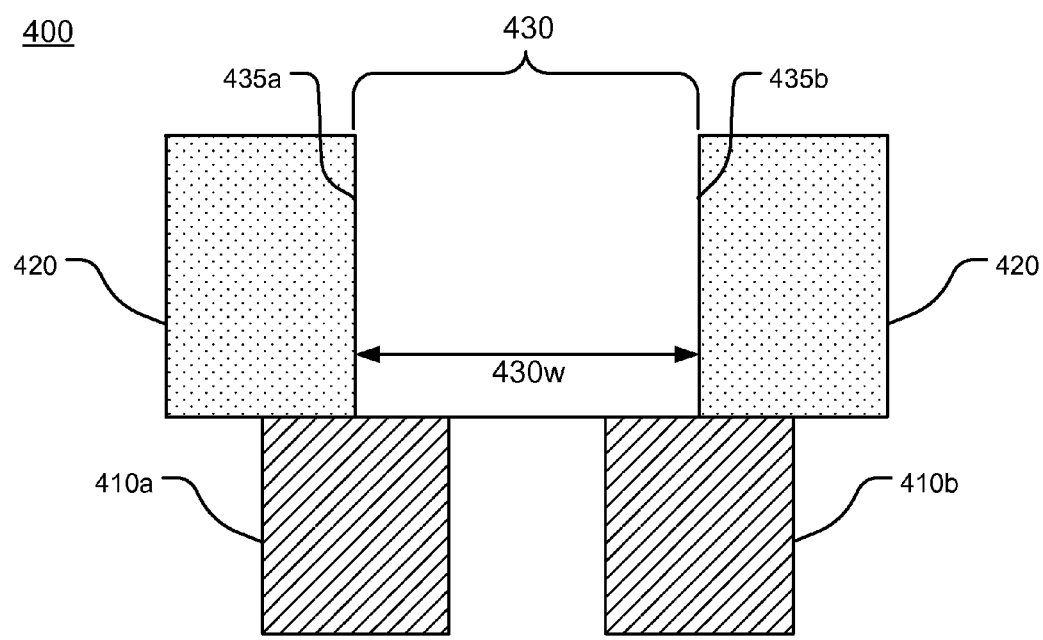
FIGS. 4-12 are cross-sectional views illustrating sub-assemblies in a fabrication sequence of phase change memory devices having thermally-confined spacer PCM cells.

FIG. 4 illustrates a cross-section of a partially fabricated substrate 400 including the array of contacts in the memory device. A patterned insulating layer 420 is formed by depositing a layer of insulating material over the array of contacts including contacts 410a and 410b. Contacts 410a and 410b are surrounded by dielectric materials such as silicon dioxide (not shown). Contacts 410a and 410b and the dielectric materials are planarized to provide a planarized surface for further processing. The patterned insulating layer 420 is formed on the planarized surface and may include oxide materials.

An etching process removes a portion of the patterned insulating layer 420 to define a pattern including sidewalls 435a and 435b aligned over contacts in the array of contacts. The etching process partially exposes top surfaces of the contacts 410a and 410b and forms a trench 430 within the patterned insulating layer 420. The trench 430 has the sidewalls 435a and 435b opposite, and optionally parallel, to each other. The trench 430 has a width 430w. The width 430w is twice the width of the contacts 410a and 410b in this example, which can be twice minimum lithographic resolution of the process used to pattern the contacts. A detailed description of the minimum lithographic resolution is provided in reference to FIG. 1B and the trench 430 with the width 430w.

Figure 5:
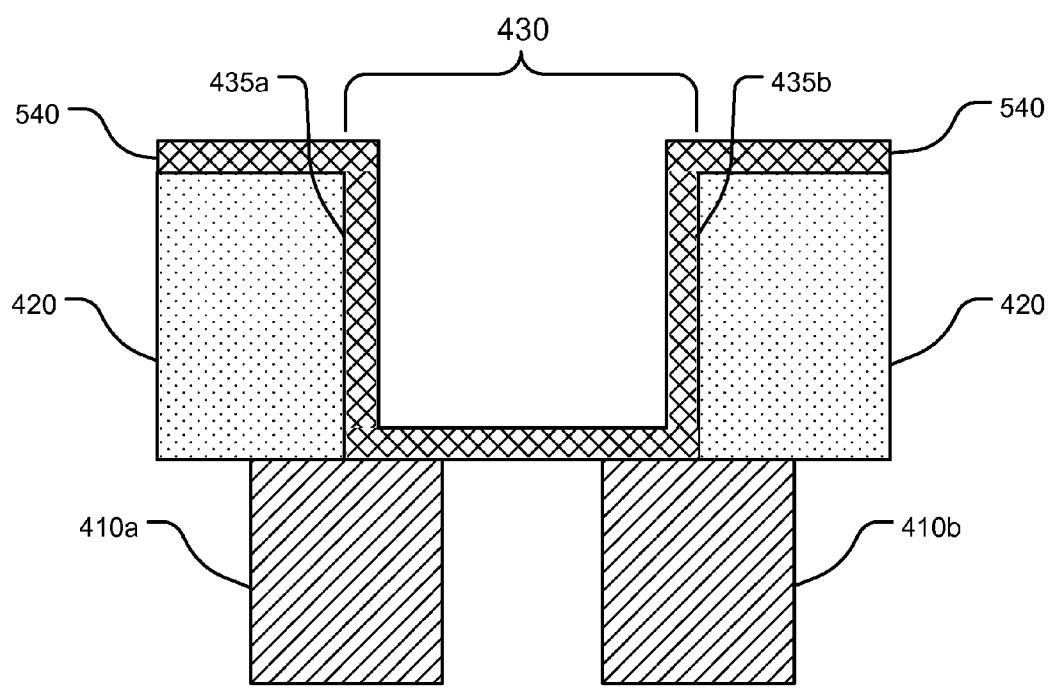

In reference to FIG. 5, a layer of electrode material 540 is deposited over the patterned insulating layer 420 and the trench 430. In particular, the layer of electrode material 540 is deposited on the sidewall 435a and on the second sidewall 435b of the trench 430, respectively.

Figure 6:
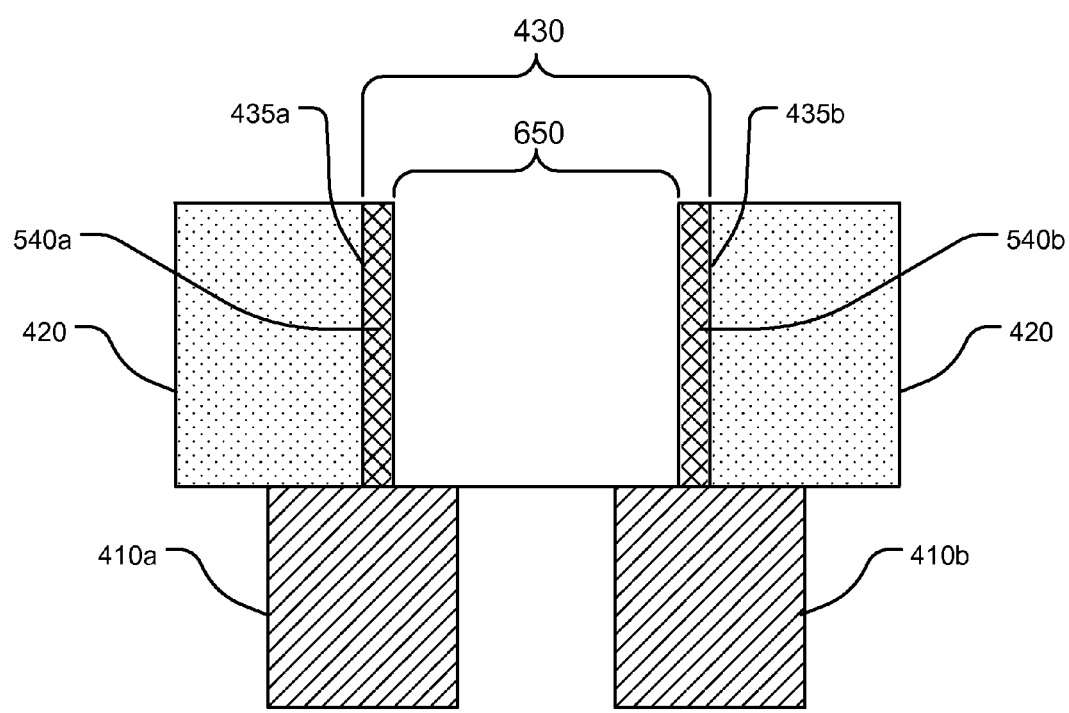

In reference to FIG. 6, a spacer etching process removes portions of the layer of electrode material 540 in a center region 650 of the trench 430 and outside the trench over the patterned insulating layer 420 surrounding the trench 430 while keeping portions 540a and 540b (i.e. spacers) of the layer of electrode material 540 lining the sidewall 435a and the second sidewall 435b of the trench 430 and contacting the partially exposed top surfaces of the contacts 410a and 410b.

Figure 7:
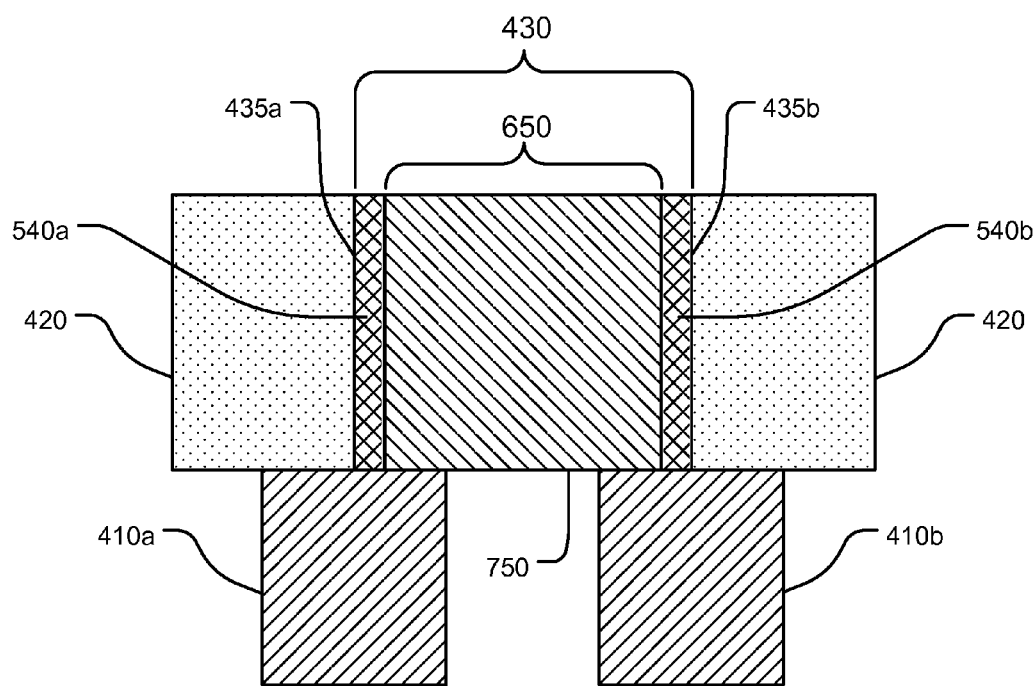

In reference to FIG. 7, the center region 650 of the trench 430 is filled with an insulating fill material 750 to form a first filled structure. The insulating fill material 750 may include a material that is selected for the ability to selectively etch it with respect to the patterned insulating layer 420. For example, the fill material 750 can be silicon nitride ($SiN_x$) when the material for the patterned insulating layer 420 is silicon oxide. A CMP (chemical-mechanical planarization) process or other process is applied to planarize the first filled structure to form a surface exposing a top surfaces of the portions 540a and 540b of electrode material.

Figure 8:
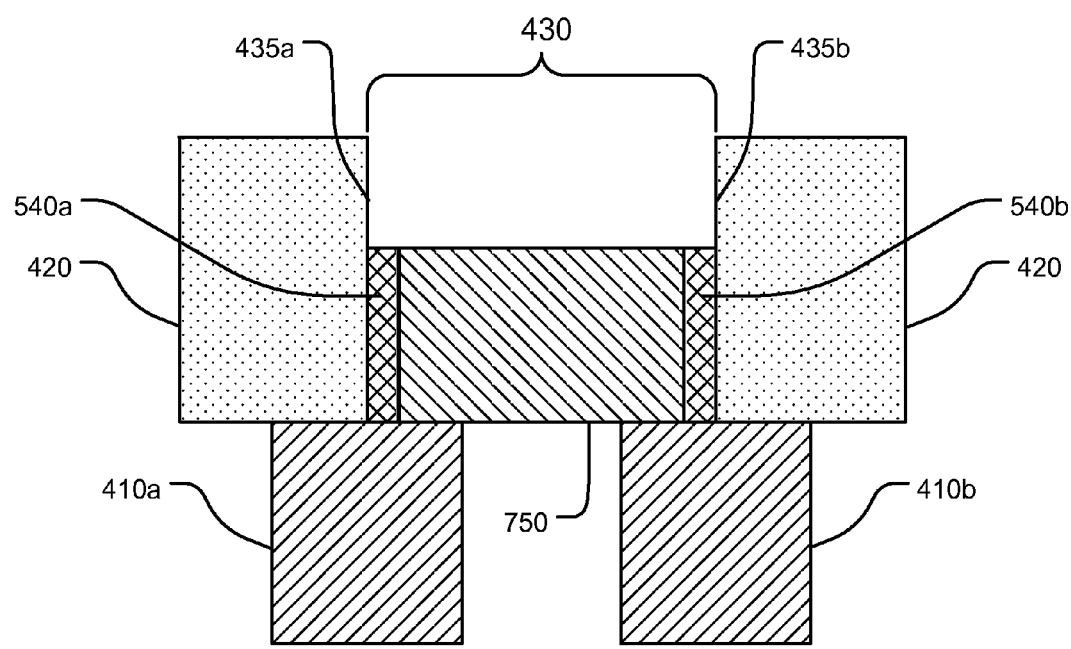

In reference to FIG. 8, an etching process etches back upper portions of the insulating fill material 750, the electrode material on the sidewall 435a, and the electrode material on the sidewall 435b to form a recess in the trench 430 leaving the portions 540a and 540b of electrode material (i.e. spacer electrodes) on the lower portion of the sidewalls 435a and 435b, respectively, and exposing the upper portion of the sidewalls 435a and 435b.

Figure 9:
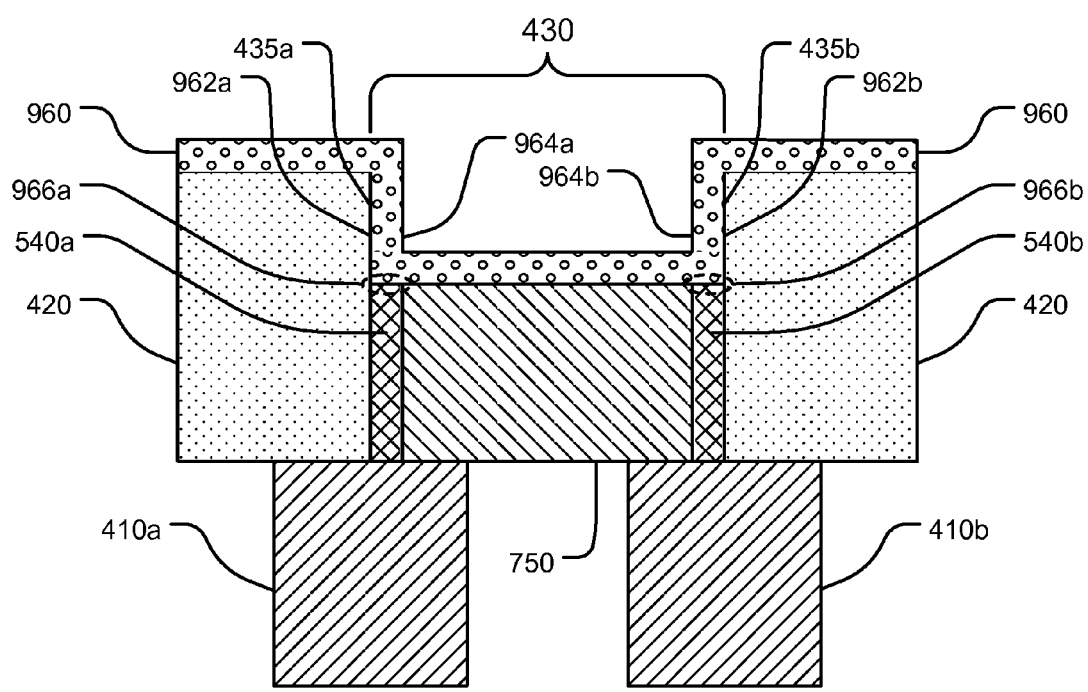

In reference to FIG. 9, a layer 960 of memory material is formed over the trench 430 and the patterned insulating layer 420 surrounding the trench 430. The layer 960 of memory material includes a spacer having a first side 962a and a second side 964a on an upper portion of the sidewall 435a. The layer 960 of memory material also includes a spacer having a first side 962b on an upper portion of the sidewall 435b, and a second side 964b opposite the first side 962b. The layer of memory material 960 contacts upper surfaces 966a and 966b of the portions 540a and 540b of electrode material, respectively. The layer of memory material 960 may include a phase change material.

Figure 10:
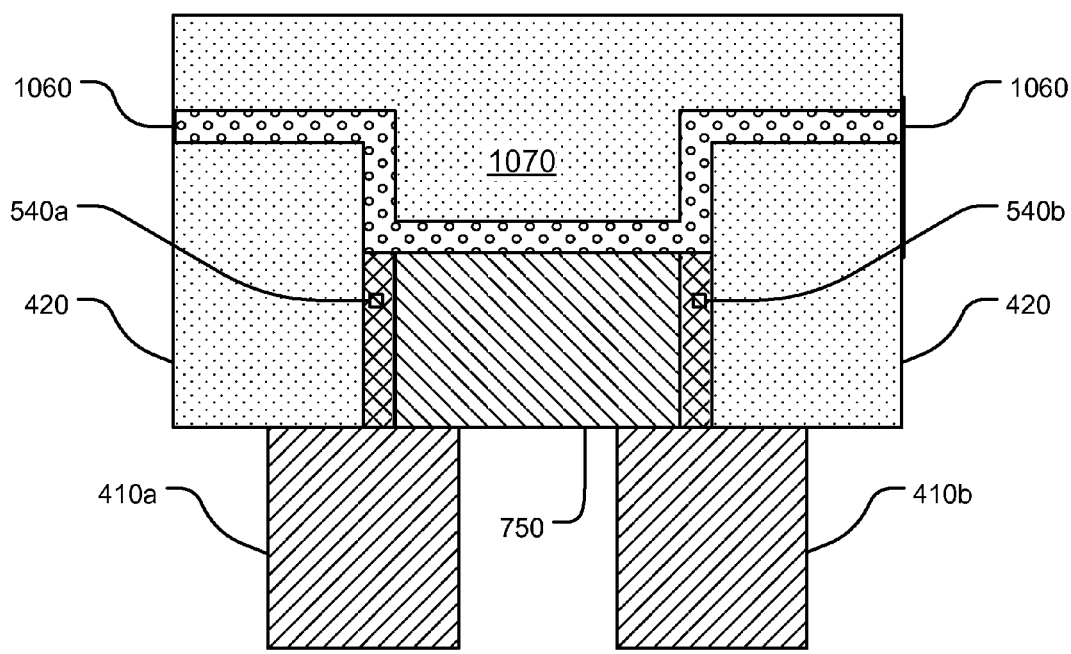

In reference to FIG. 10, the second sides 964a and 964b of the layer of memory material 960 are covered with an insulating fill material 1070 to form a confined layer 1060 of memory material between the patterned insulating layer 420 and the insulating fill material 1070.

Figure 11:
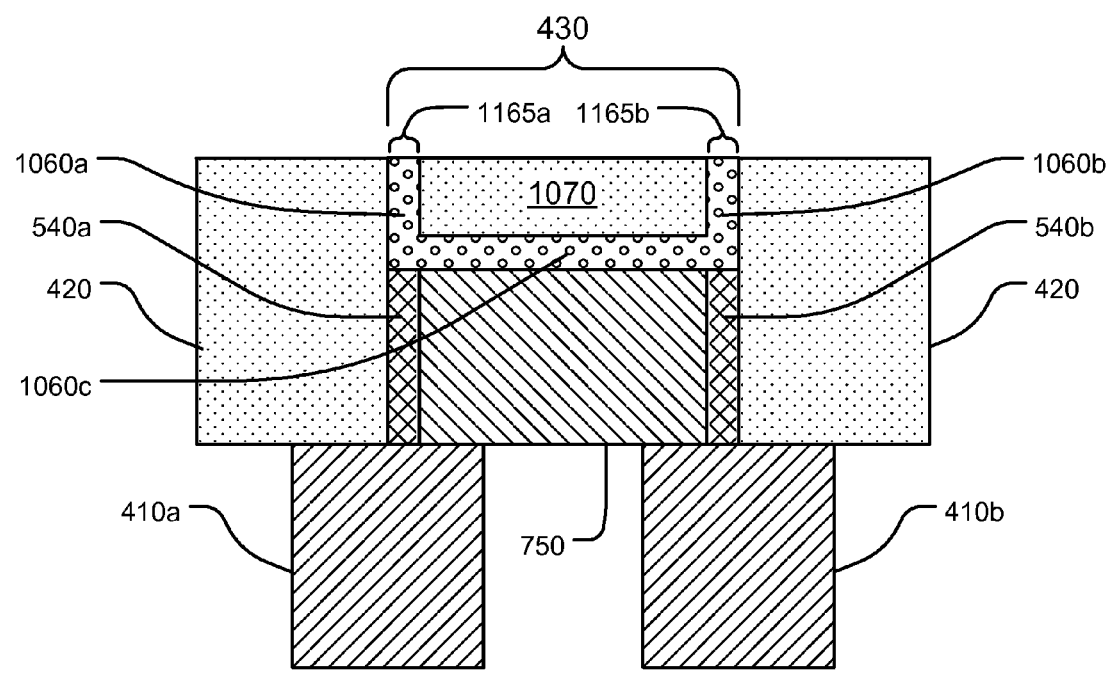

In reference to FIG. 11, a second CMP (chemical-mechanical planarization) process exposes top surfaces 1165a and 1165b of the confined layer of memory material 1060. The confined layer of memory material 1060 subsequently includes two vertical spacers connected by a horizontal part.

Figure 12:
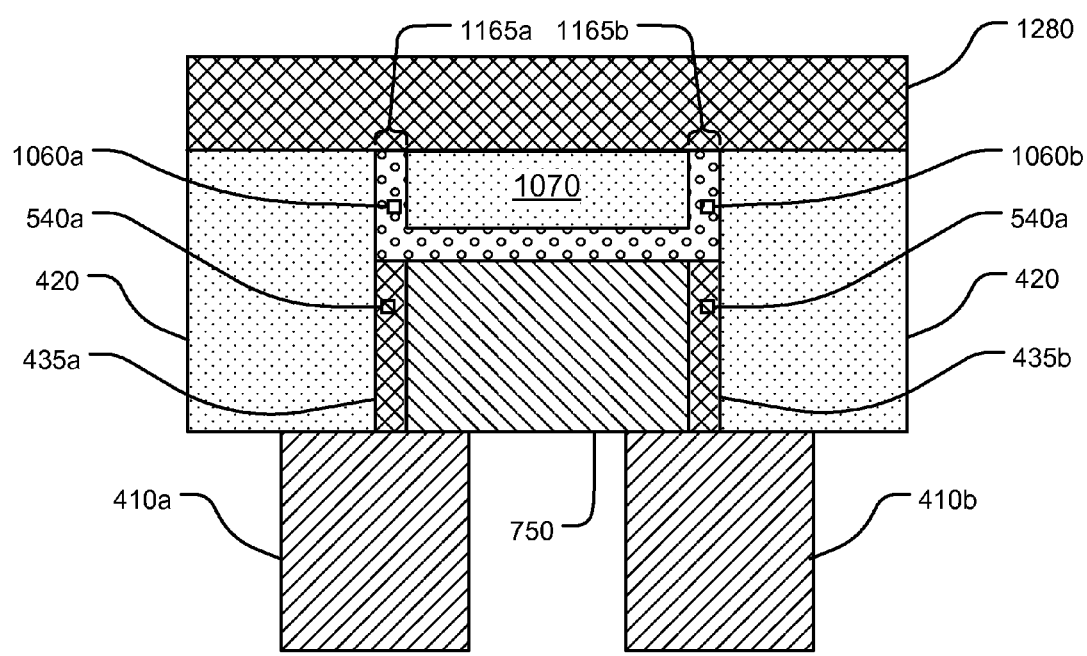
Figure 13:
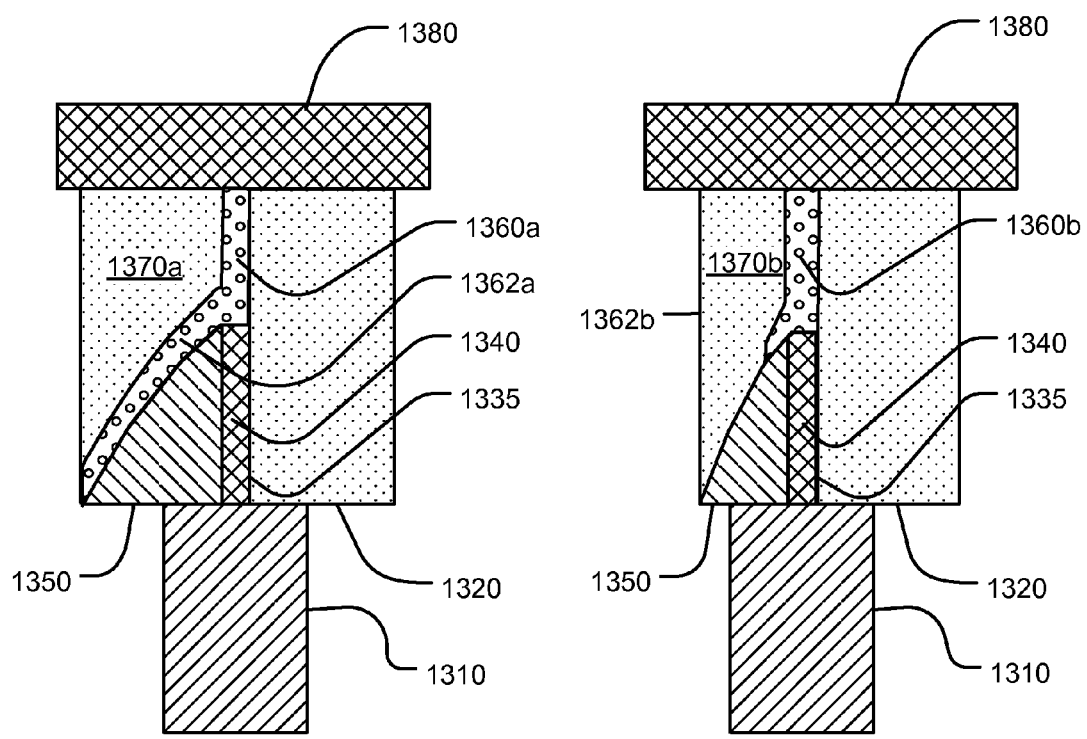
FIGS. 13A-13B illustrate two alternative example unit cells in an array of thermally-confined spacer PCM cells.

In reference to FIG. 12, a layer of top electrode material 1280 is formed over the confined layer of memory material 1060a and 1060b, and the insulating fill material 1070. The layer of top electrode material 1280 is in contact with the confined layer of memory material 1060a and 1060b via the top surfaces 1165a and 1165b. The layer of top electrode material 1280 may include titanium-nitride (TiN), tantalum nitride (TaN), titanium aluminum nitride (TiAlN), tantalum aluminum nitride (TaAlN), other metals, or metal oxides. Subsequent bit line patterning etches through the layer of top electrode material 1280, the confined layer of memory material 1060a and 1060b, and the portions 540a and 540b (i.e. spacers) of the layer of electrode material 540 lining the sidewall 435a and the second sidewall 435b, and stops on top surfaces of the contacts 410a and 410b, to pattern bit lines as illustrated in FIG. 3A and FIG. 3B.

FIG. 13A illustrates an alternative example unit cell in an array of thermally-confined spacer PCM cells. FIG. 13A illustrates a cross-section of an example unit cell in a memory device including an array of thermally-confined spacer PCM (phase change memory) cells. The memory device includes an array of contacts having top surfaces. The memory device includes a patterned insulating layer 1320 having a sidewall feature, over a contact 1310 in a plurality of contacts in the array of contacts. The patterned insulating layer 1320 may include oxide materials. The sidewall feature 1335 is aligned over the top surface of the contact 1310 in the plurality of contacts.

The memory device includes a bottom electrode 1340 in a plurality of bottom electrodes formed on a lower portion of the sidewall feature 1335 within the patterned insulating layer 1320. The bottom electrode 1340 contacts the top surfaces of the contact 1310 in the plurality of contacts. The bottom electrode 1340 is surrounded by the patterned insulating layer 1320 on one side and an insulating fill material 1350 on an opposite side. A top surface of the insulating fill material 1350 forms a slope that extends from the electrode top surface of the bottom electrode 1340 downward until it reaches a level aligned in this illustration with the top surface of the contact 1310. The insulating fill material 1350 fills the region enclosed by the slope, the bottom electrode 1340, and the bottom of the trench. The insulating fill material 1350 may include silicon nitride ($SiN_x$).

A confined spacer 1360a of memory material is formed between the patterned insulating layer 1320 and an insulating fill material 1370a on an upper portion of the sidewall feature 1335 and over the insulating fill material 1350. The confined spacer of memory material 1360a is in contact with the electrode top surface of the bottom electrode 1340. A layer of memory material 1362a extends along and over the slope that forms the top surface of the insulating fill material 1350, in this illustration, from where the confined spacer of memory material 1360a contacts the electrode top surfaces of bottom electrode 1340.

The confined spacer 1360a of memory material includes a phase change material in this example.

An electrode 1380 is formed over the confined spacer of memory material 1360a, the insulating fill material 1370a, and the patterned insulating layer 1320. The electrode 1380 is in contact with a top surface of the confined spacer of memory material 1360a which is in contact with the bottom electrode 1340. The electrode 1380 may include titanium-nitride (TiN).

FIG. 13B illustrates a second alternative example unit cell in an array of thermally-confined spacer PCM cells. FIG. 13B illustrates a cross-section of an example unit cell in a memory device including a thermally-confined spacer PCM (phase change memory) cell. The memory device includes an array of contacts, including contact 1310 having a top surface. The memory device includes a patterned insulating layer 1320 over contact 1310. The patterned insulating layer 1320 may include oxide materials. The patterned insulating layer 1320 includes a sidewall feature 1335, such as the sidewall of a trench. The sidewall feature 1335 aligned over the top surface of the contact 1310 in the plurality of contacts.

The memory device includes a bottom electrode 1340 in a plurality of bottom electrodes formed on a lower portion of the sidewall feature 1335 within the patterned insulating layer 1320. The bottom electrode 1340 contacts the top surface of the contact 1310. The bottom electrode 1340 is surrounded by the patterned insulating layer 1320 on one side and an insulating fill material 1350 on an opposite side. A top surface of the insulating fill material 1350 forms a slope that extends from the electrode top surface of the bottom electrode 1340 downward until it reaches a level of the top of the contact 1310. The insulating fill material 1350 fills the region enclosed by the slope, the bottom electrode 1340, and the bottom of the sidewall feature. The insulating fill material 1350 may include silicon nitride ($SiN_x$).

A confined layer of memory material 1360*b* is formed between the patterned insulating layer 1320 and an insulating fill material 1370*b* on an upper portion of the sidewall feature 1335 of the trench. The confined layer of memory material 1360*b* is in contact with the electrode top surfaces of the plurality of bottom electrodes including bottom electrode 1340 in the plurality of bottom electrodes. A layer of memory material 1362*b* extends along and over a part of the slope that forms the top surface of the insulating fill material 1350 from where the confined layer of memory material 1360*b* contacts the electrode top surfaces of bottom electrode 1340.

The confined layer of memory material 1360*b* includes a phase change material. The memory device includes an array of access devices coupled to the array of contacts. An access device may be a diode or a transistor.

An electrode 1380 is formed over the confined layer of memory material 1360*b*, the insulating fill material 1370*b*, and the patterned insulating layer 1320. The electrode 1380 is in contact with a top surface of the confined layer 1360*b* of memory material which is in contact with the bottom electrode 1340. The electrode 1380 may include titanium-nitride (TiN).

Figure 14:
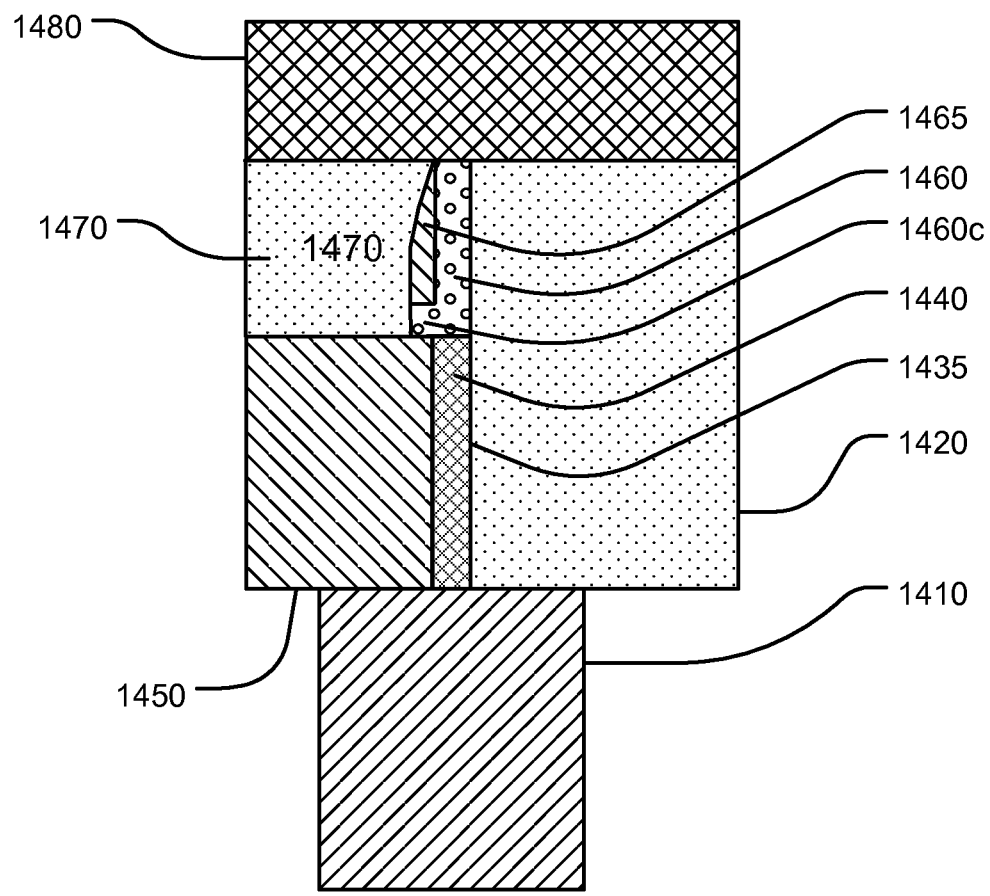
FIG. 14 illustrates a third alternative example unit cell in an array of thermally-confined spacer PCM cells.

FIG. 14 illustrates a third alternative example unit cell in an array of thermally-confined spacer PCM cells. FIG. 14 illustrates a cross-section of an example unit cell in a memory device including an array of thermally-confined spacer PCM (phase change memory) cells. The memory device includes contact 1410 having a top surface. The memory device includes a patterned insulating layer 1420 over the contact 1410. The patterned insulating layer 1420 may include oxide materials. The patterned insulating layer 1420 includes a sidewall feature 1435, such as the sidewall of a trench, aligned over the top surface of the contact 1410.

The memory device includes a bottom electrode 1440 formed on a lower portion of the sidewall feature 1435 within the patterned insulating layer 1420. The bottom electrode 1440 contacts the top surface of the contact 1410. The bottom electrode 1440 is surrounded by the patterned insulating layer 1420 on one side and an insulating fill material 1450 on an opposite side. The electrode top surface of the bottom electrode 1440 and a top surface of the insulating fill material 1450 are co-planar with each other. The insulating fill material 1450 may include silicon nitride ($SiN_x$).

A confined layer 1460 (i.e. spacer) of memory material is formed between the patterned insulating layer 1420 and an insulating spacer 1465 on an upper portion of the sidewall feature 1435. The confined layer 1460 of memory material is in contact with the electrode top surface of the bottom electrode 1440. A layer of memory material 1460*c* extends less than the width of the trench from the confined layer of memory material 1460 beneath the insulating spacer 1465.

The layer 1460*c* of memory material extends along and over a part of the top surface of the insulating fill material 1450 from where the confined layer of memory material 1460 contacts the electrode top surfaces of bottom electrode 1440. A layer of insulating fill material 1470 overlies insulating spacer 1465 and the confined layer 1460 of memory material. The insulating fill material 1470 may include oxide materials. The layer of insulating spacer 1465 may include nitride materials such as silicon nitride.

The confined layer of memory material 1460 includes a phase change material. The memory device includes an array of access devices coupled to the array of contacts. An access device may be a diode or a transistor.

An electrode 1480 is formed over the confined layer 1460 of memory material, the insulating fill material 1470, and the patterned insulating layer 1420. The electrode 1480 is in contact with a top surface of the confined layer 1460 of memory material which is in contact with the bottom electrode 1440. The electrode 1480 may include titanium-nitride (TiN).

Figure 15:
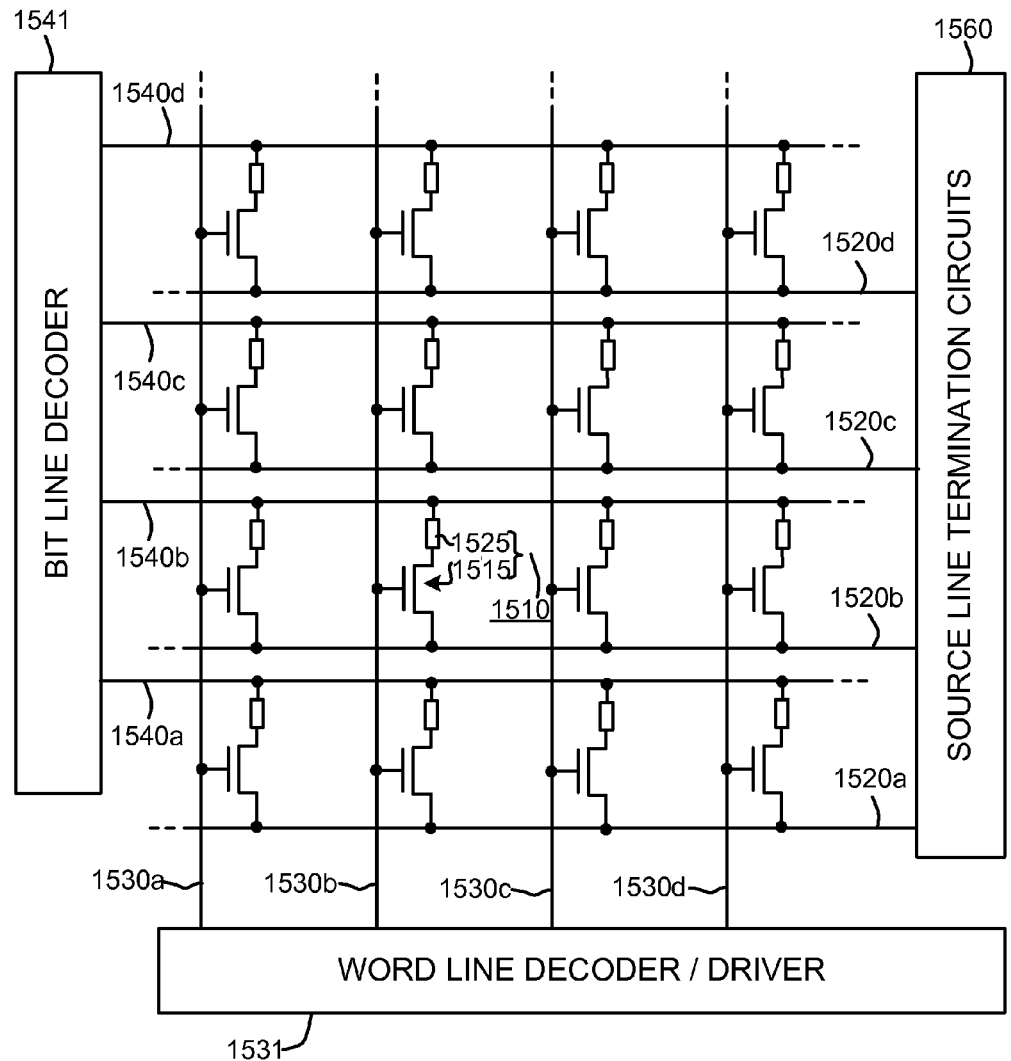
FIG. 15 is a schematic diagram of a memory array including phase change memory elements using transistors as access devices in accordance with an implementation.

FIG. 15 is a schematic diagram of a portion of a memory cell array 1500 implemented using phase change memory cells or other programmable resistance cells using transistors as access devices. The array 1500 comprises a plurality of bit lines 1540*a*-1540*d* extending in parallel in a first direction and in electrical communication with bit line decoder 1541. A plurality of word lines 1530*a*, 1530*b*, 1530*c*, 1530*d* extend in parallel in a second direction and are in electrical communication with word line decoder/driver 1531. In the schematic diagram of FIG. 15, each of the memory cells (e.g. a cell including phase change memory element 1525) of array 1500 is coupled to an access device (e.g. transistor 1515) arranged in electrical series between a bit line in the set of bit lines 1540*a*-1540*d*, that is in turn coupled to a bit line decoder 1541, and a source line 1520*a*-1520*d*. Other devices can be arranged to act as access devices including, for example, bipolar junction transistors and diodes, in memory arrays of this sort.

Memory cell 1510 is representative of memory cells in array 1500 and includes a memory element 1525 coupled to an access device such as a field effect transistor 1515. The memory cell 1510 is a thermally-confined spacer PCM cell. The memory element 1525 includes a phase change material. The memory element 1525 and transistor 1515 are arranged electrically in series between the bit line (e.g. 1540*b*) and the corresponding source line termination circuits 1560 via the source line 1520*b*. The word line 1530*b* controls the gate terminal of the transistor 1515.

Figure 16:
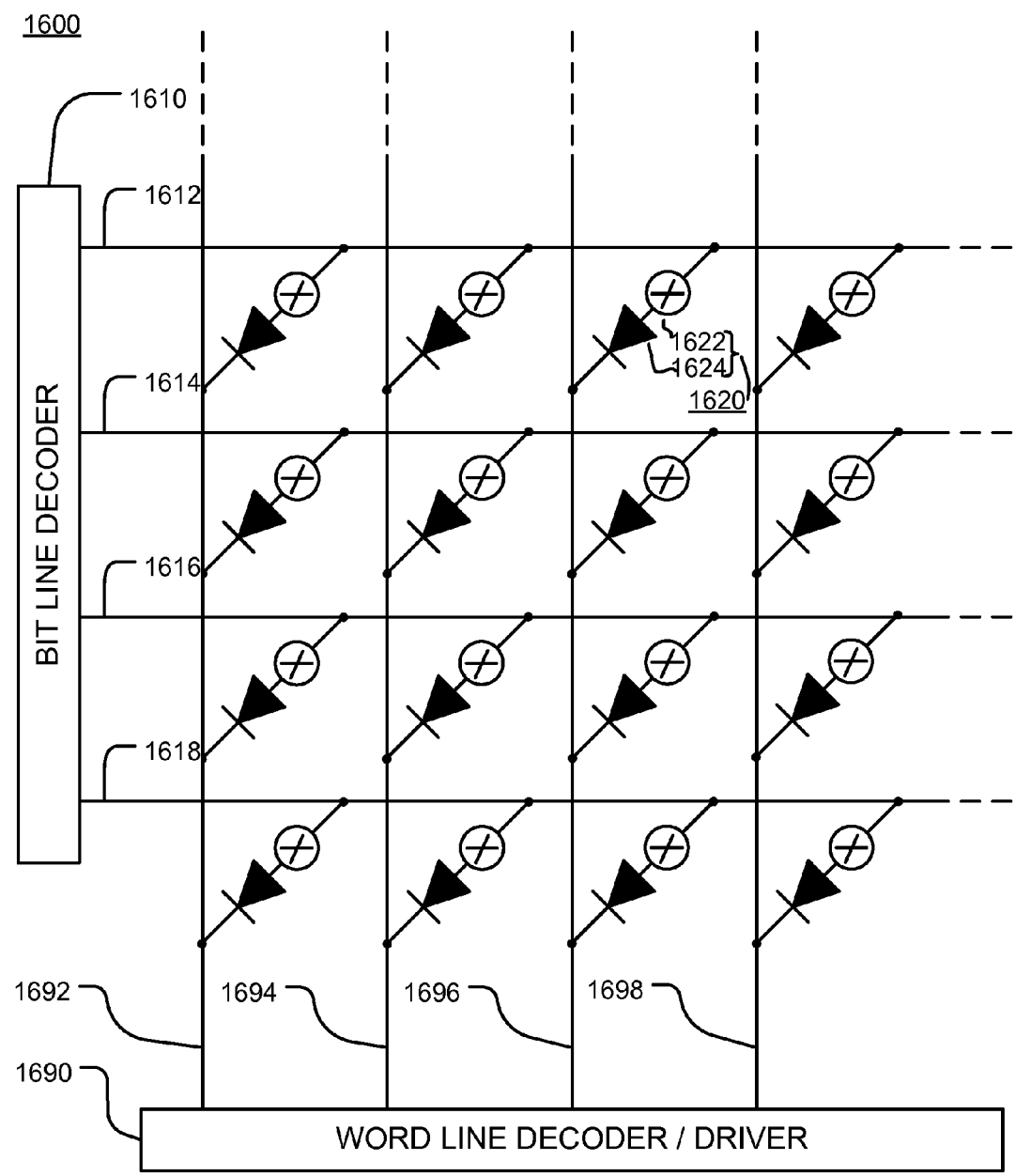
FIG. 16 is a schematic diagram of a memory array including phase change memory elements using diodes as access devices in accordance with an implementation.

FIG. 16 is a schematic diagram of a portion of a memory cell array 1600 implemented using phase change memory cells or other programmable resistance cells using diodes as access devices. The array 1600 comprises a plurality of bit lines 1612, 1614, 1616, and 1618 extending in parallel in a first direction and in electrical communication with a bit line decoder 1610. A plurality of word lines 1692, 1694, 1696, and 1698 extend in parallel in a second direction and are in electrical communication with word line decoder/driver 1690. In the schematic diagram of FIG. 16, each of the memory cells (e.g. a cell including phase change memory element 1622) of array 1600 is coupled to an access device (e.g. diode 1624) arranged in electrical series between a bit line in the set of bit lines 1612, 1614, 1616, and 1618, that is in turn coupled to the bit line decoder 1610.

Memory cell 1620 is representative of memory cells in array 1600 and includes a memory element 1622 coupled to an access device such as a diode 1624. The memory cell 1620 is a thermally-confined spacer PCM cell. The memory element 1622 includes a phase change material. The memory element 1622 and diode 1624 are arranged electrically in series between the bit line (e.g. 1612) and the word line 1696.

Figure 17:
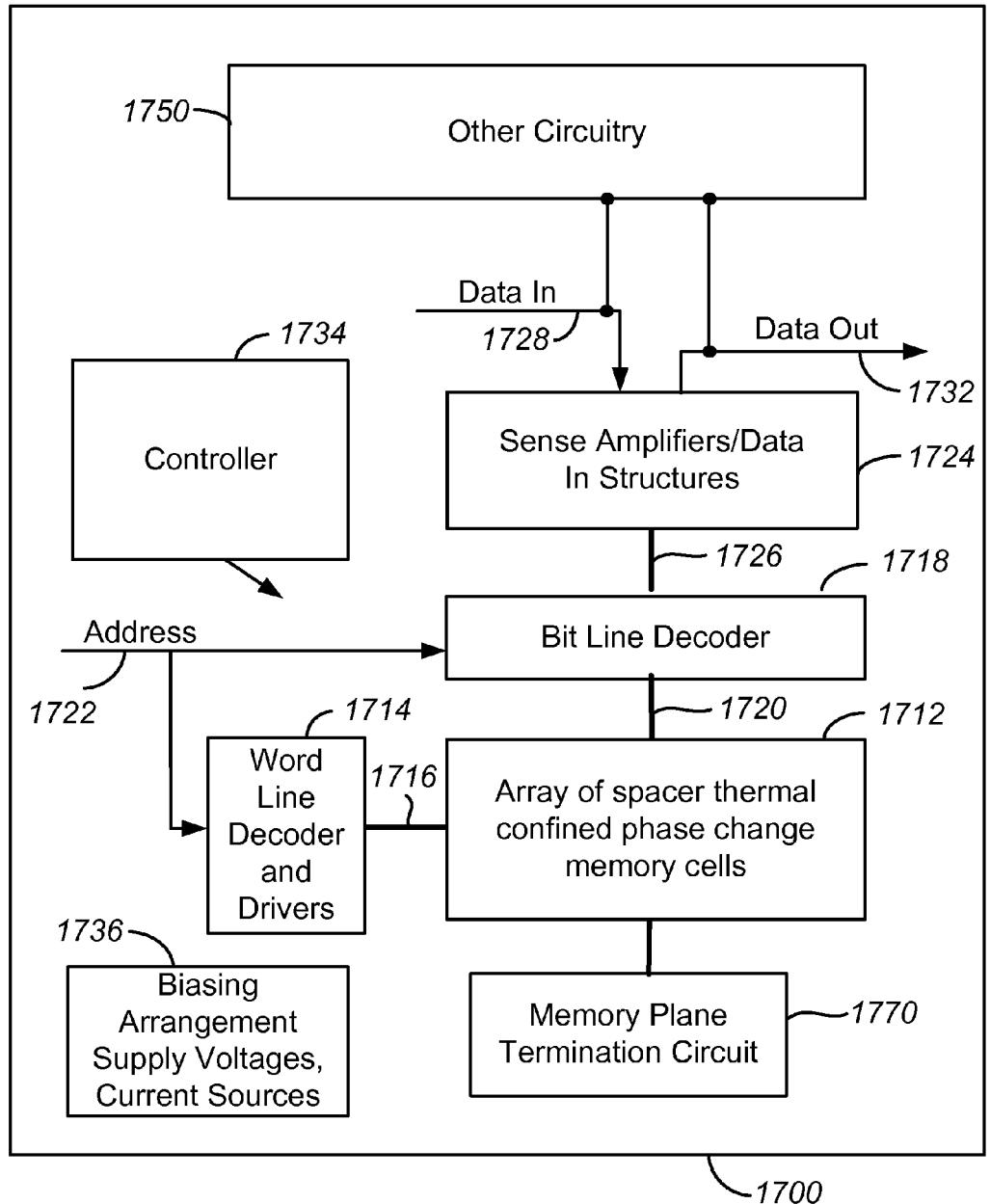
FIG. 17 is a block diagram of an integrated circuit device including a phase change memory array in accordance with an implementation.

FIG. 17 is a simplified block diagram of an integrated circuit 1700 including a memory array 1712 implemented using thermally-confined spacer phase change memory cells as described herein. A memory plane termination circuit 1770 is coupled to the array and provides a common voltage to the memory plane of the array 1712. A word line decoder and drivers 1714 is coupled to and in electrical communication with a plurality of word lines 1716 arranged along rows in the memory array 1712. A bit line (column) decoder 1718 is in electrical communication with a plurality of bit lines 1720 arranged along columns in the array 1712. Addresses are supplied on bus 1722 to word line decoder and drivers 1714 and bit line decoder 1718. Sense amplifiers and data-in structures in block 1724, including voltage and/or current sources for the read, set, and reset modes are coupled to bit line decoder 1718 via data bus 1726. Data is supplied via a data-in line 1728 from input/output ports on integrated circuit 1700, or from other data sources internal or external to integrated circuit 1700, to data-in structures in block 1724. Other circuitry 1750 may be included on integrated circuit 1700, such as a general purpose processor or special purpose application circuitry, or a combination of modules providing system-on-a-chip functionality supported by array 1712. Data is supplied via a data-out line 1732 from the sense amplifiers in block 1724 to input/output ports on integrated circuit 1700, or to other data destinations internal or external to integrated circuit 1700.

A controller 1734 implemented, in this example, using a bias arrangement state machine, controls the application of bias arrangement supply voltages and current sources 1736, such as read, set, reset, erase, verify and program verify voltages and/or currents. Controller 1734 may be implemented using special-purpose logic circuitry as known in the art. In alternative implementations, controller 1734 comprises a general-purpose processor, which may be implemented on the same integrated circuit to execute a computer program to control the operations of the device. In yet other implementations, a combination of special-purpose logic circuitry and a general-purpose processor may be utilized for implementation of controller 1734.

The present technology provides a memory cell structure with thermal isolation benefits and without the issue of filling in trenches with narrow widths of 7.5 nanometers or less. In the memory cell structure, the phase change material can be deposited on sidewalls of a trench having a width twice a minimum lithographic resolution. If the minimum lithographic resolution is 17 nanometers, then twice the minimum lithographic resolution is 34 nanometers. Thus the memory cell structure of the present technology provides better scalability than the prior art. A conventional CVD (chemical vapor deposition), PVD (physical vapor deposition), or ALD (atomic layer deposition) process can be used to fabricate the memory device described herein, while achieving very small thicknesses of the memory element. With advanced technology, such as double patterning technology (DPT) and quadruple patterning technology (QPT), the feature size may be even smaller than the minimum lithographic resolution. Consequently, the present technology can result in trenches with even narrower widths than "2F" in which to implement thermally-confined spacer PCM cells, and such memory cells may occupy an area smaller than "$4F^2$" per cell.

While the present technology is disclosed by reference to the preferred implementations and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an array of contacts having top surfaces;
    a patterned insulating layer over the array of contacts, the patterned insulating layer including sidewall features aligned with and directly overlying the top surfaces of a plurality of contacts in the array;
    a plurality of bottom electrodes, the bottom electrodes including respective sidewall electrode layers on lower portions of the sidewall features contacting respective top surfaces of the contacts in the plurality of contacts, the bottom electrodes having electrode top surfaces;
    a first insulating fill material disposed adjacent to the sidewall electrode layers with the bottom electrodes between the first insulating fill material and the patterned insulating layer;
    a second insulating fill material, formed as a separate element from the first insulating fill material and directly overlying the first insulating fill material, disposed adjacent to upper portions of the sidewall features;
    the first insulating fill material and the second insulating fill material having substantially the same widths between two adjacent sidewall features of the patterned insulating layer; and
    a plurality of memory elements comprising a confined layer of memory material between the upper portions of the sidewall features and the second insulating fill material, the memory elements in contact with the electrode top surfaces of the plurality of bottom electrodes and a portion of each memory element in the plurality of memory elements is in contact with two adjacent bottom electrodes of the plurality of bottom electrodes.

2. The memory device of claim 1, wherein a thickness of the confined layer of memory material is less than 7.5 nanometers.

3. The memory device of claim 1, wherein the patterned insulating layer includes a trench having first and second opposing sidewalk, and said sidewall features include the opposing sidewalk of the trench.

4. The memory device of claim 1, the memory elements respectively including a layer of memory material between the first insulating fill material and the second insulating fill material, and extending away from the corresponding sidewall feature.

5. A memory device, comprising:
    an array of contacts having top surfaces, the array of contacts comprising first and second spaced apart contacts;
    a patterned insulating layer over the array of contacts, the patterned insulating layer including sidewall features aligned with and directly overlying the top surfaces of a plurality of contacts in the array;
    a plurality of bottom electrodes, the bottom electrodes including respective sidewall electrode layers on lower portions of the sidewall features contacting respective top surfaces of the contacts in the plurality of contacts, the bottom electrodes having electrode top surfaces;
    insulating fill material disposed adjacent to the sidewall features;
    a plurality of memory elements comprising a confined layer of memory material between the patterned insulating layer and the insulating fill material on an upper portion of the sidewall features, the memory elements in contact with the electrode top surfaces of the plurality of bottom electrodes;

the patterned insulating layer including a trench having first and second opposing sidewalls, and said sidewall features including the first and second opposing sidewalk of the trench, the first and second opposing sidewalls directly overlying the top surfaces of the first and second spaced apart contacts; and a layer of memory material extending across the entire width of the trench from the confined layer of memory material in the memory element on the first opposing sidewall to the confined layer of memory material in the memory element on the second opposing sidewall, wherein the insulating fill material has a top portion over the layer of memory material and a bottom portion under the layer of memory material, and the top portion and the bottom portion having substantially the same widths between the first opposing sidewall and the second sidewall.

6. The memory device of claim 1, wherein the confined layer of memory material comprises a phase change material.

7. The memory device of claim 1, further comprising an array of access devices coupled to the array of contacts.

8. The memory device of claim 4, wherein the layer of memory material extends across the entire width of the trench.

9. The memory device of claim 8, wherein the layer of memory material completely separate the first insulating fill material from the second insulating fill material.

10. The memory device of claim 5, wherein the confined layer of memory material has first and second surfaces on opposite sides thereof, the confined layer of memory material being between said patterned insulating layer and the insulating fill material with said first and second surfaces in direct contact with said patterned insulating layer and the insulating fill material.

* * * * *

UNITED STATES PATENT AND TRADEMARK OFFICE
CERTIFICATE OF CORRECTION

| | | |
|---|---|---|
| PATENT NO. | : 8,981,330 B2 | Page 1 of 1 |
| APPLICATION NO. | : 13/550218 | |
| DATED | : March 17, 2015 | |
| INVENTOR(S) | : Hsiang-Lan Lung | |

It is certified that error appears in the above-identified patent and that said Letters Patent is hereby corrected as shown below:

In the Claims

In claim 3, column 12, line 44, delete the word "sidewalk" and insert the word -- sidewall --; and
line 45, delete the word "sidewalk" and insert the word -- sidewall --.

In claim 5, column 13, lines 6-7, delete the word "side-walk" and insert the word -- sidewalls --.

In claim 5, column 13, line 19, after the word "second" insert the word -- opposing --.

Signed and Sealed this
Twenty-first Day of July, 2015

Michelle K. Lee
*Director of the United States Patent and Trademark Office*